United States Patent [19]

Norris

[11] 4,412,151
[45] Oct. 25, 1983

[54] PIEZOELECTRIC CRYSTAL SPARK PLUG

[75] Inventor: Elwood G. Norris, Salt Lake City, Utah

[73] Assignee: Charles W. Taggart, Salt Lake City, Utah

[21] Appl. No.: 183,253

[22] Filed: Sep. 2, 1980

[51] Int. Cl.³ .......................... H01J 7/44; H01J 17/34; H01J 19/78; H01J 29/96
[52] U.S. Cl. ..................................... 315/55; 313/118; 123/642; 315/57
[58] Field of Search ............. 315/55, 57; 123/148 AB, 123/642; 313/118

[56] References Cited

U.S. PATENT DOCUMENTS

| | | | |
|---|---|---|---|
| 2,202,220 | 5/1940 | Miller | 315/55 X |
| 2,717,916 | 9/1955 | Harkness | 315/55 X |
| 3,173,055 | 3/1965 | Harkness | 315/55 |
| 3,215,133 | 11/1965 | Farrell | 315/55 |
| 3,247,423 | 4/1966 | Nolta et al. | 315/55 X |
| 3,361,929 | 1/1968 | Vandover | 315/55 |
| 3,363,139 | 1/1968 | Schiavone | 315/55 |
| 3,444,850 | 5/1969 | Horan | 315/55 X |
| 3,457,461 | 7/1969 | Steinke et al. | 315/55 X |
| 3,558,903 | 1/1971 | Yamano | 315/55 |
| 4,275,334 | 6/1981 | Beeghly | 315/57 |

FOREIGN PATENT DOCUMENTS 1275329 8/1968 Fed. Rep. of Germany ........ 315/55

*Primary Examiner*—Saxfield Chatmon, Jr.
*Attorney, Agent, or Firm*—Thorpe, North & Western

[57] ABSTRACT

A piezoelectric crystal spark plug includes a body similar to a conventional spark plug, a central electrode extending from the bottom end of the body, and a ground electrode disposed near but spaced from one end of the central electrode and connected to the body. A piezoelectric crystal is included within the body and one side of the crystal is electrically coupled to the other end of the central electrode. A deforming device is also included within the body to deform the crystal and cause it to produce and apply an electrical signal to the central electrode. This electrical signal produces a spark between the central and ground electrode similar to a conventional spark plug. The deforming device can include a striker element for striking the crystal to deform it, a second low voltage piezoelectric crystal coupled to the first mentioned piezoelectric crystal so that when a low voltage signal is applied to the second crystal it deforms to thereby deform the first piezoelectric crystal, a solenoid disposed in the body to strike or apply a force to the piezoelectric crystal to deform it in response to a low voltage signal, or other suitable deforming devices.

10 Claims, 6 Drawing Figures

PIEZOELECTRIC CRYSTAL SPARK PLUG

BACKGROUND OF THE INVENTION

This invention relates to a spark plug which may create a spark in response to a low voltage signal.

The conventional spark plug used in internal combustion engines to ignite a compressed fuel and air mixture in a cylinder consists of a spark plug body which may be screwed into an opening leading to an engine cylinder. The spark plug also includes a ground electrode which is electrically coupled to the body, and a central electrode which is insulated from the body and which is electrically coupled to a distribution wire over which is received a high voltage signal. Upon receipt of the signal, a spark is created between the central electrode and the ground electrode to ignite the fuel and air mixture in the cylinder.

In order to create the high voltage signal which is supplied to the spark plugs, a high voltage coil must be provided along with a distributor, points and condensor, and high voltage spark plug wires. The high voltage signals carried by the spark plug wires oftentimes result in interference with external radio frequency signals which results in losing radio reception. Additionally, the high voltage signals can cause shocks to a person attempting to repair an engine containing such spark plugs.

SUMMARY OF THE INVENTION

It is an object of the invention to provide a spark plug for use with internal combustion engines and which eliminates the need for a high voltage input signal in order to produce a spark.

It is another object of the invention to provide such a spark plug which will produce a spark in response to a low voltage signal of a magnitude which generally would not interfere with radio frequency signals.

It is a further object of the invention to provide such a spark plug which eliminates many of the accessory elements of the electrical system of an engine presently necessary for conventional spark plugs, and which would allow simple electronic control of the firing function.

It is also an object of the invention in accordance with one aspect thereof to provide a spark plug adapter which may be attached to a conventional spark plug for causing the spark plug to produce a spark in response to a low voltage signal.

The above and other objects of the invention are realized in a specific illustrative embodiment thereof which includes a spark plug body, a central electrode electrically insulated from the body, a ground electrode electrically coupled to the body and disposed near but spaced from one end of the central electrode, and a piezoelectric crystal disposed within the body in electrical contact with the central electrode. Also included is an element or device for deforming the piezoelectric crystal to cause it to produce an electrical signal for application to the central electrode to thereby produce a spark between the central electrode and ground electrode. Such element or device can take a variety of configurations including a striker element movable within the spark plug body to strike the piezoelectric crystal when it, in turn, has been struck by an external striker device. Other configurations could include the use of a second piezoelectric crystal responsive to a low voltage signal for deforming, wherein the second crystal is mechanically coupled to the first piezoelectric crystal so that when the second crystal is deformed, it causes the first crystal to deform the spark producing crystal and thereby produce the spark signal. Another arrangement for deforming the piezoelectric crystal would be a conventional solenoid disposed within the spark plug body to respond to a low voltage signal to strike or stress the crystal and thereby deform it. It is apparent that other deforming elements or devices could be provided to produce the desired result of deforming the piezoelectric crystal to cause it to produce the spark.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 1:
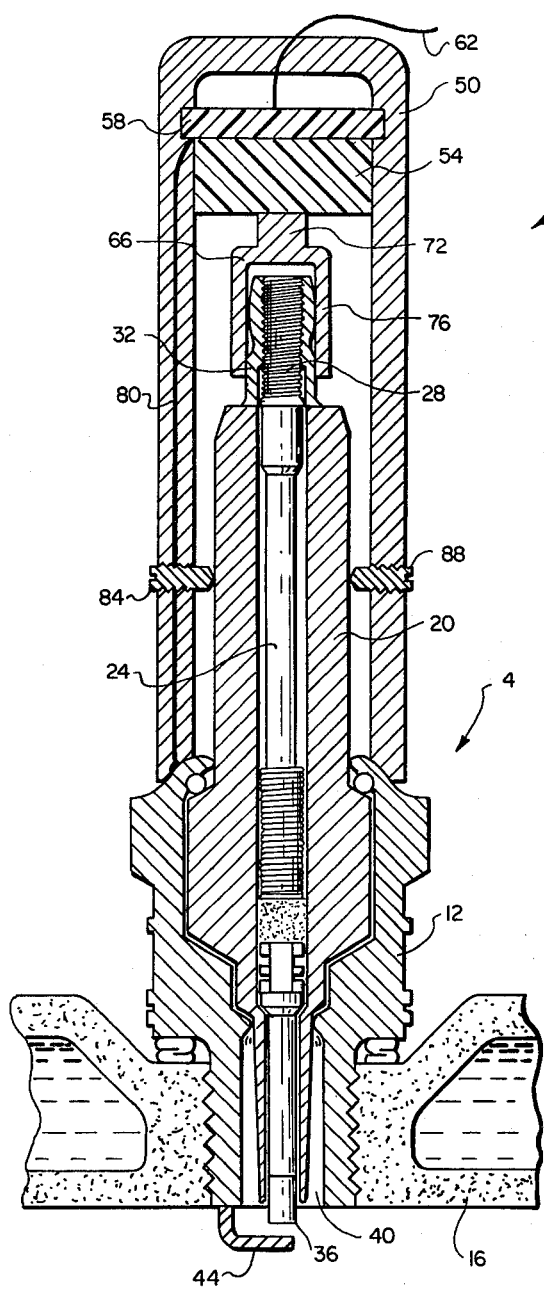
FIG. 1 shows a side, cross-sectional view of a conventional spark plug with an adapter made in accordance with the present invention mounted over such spark plug.

Referring to FIG. 1, there is shown a side, cross-sectional view of a conventional spark plug 4 on which is mounted an adapter unit 8 made in accordance with the present invention. The conventional spark plug 4 includes a body 12, the lower portion of which is threaded to enable screwing the spark plug into a threaded opening formed in an internal combustion engine block 16. The body 12 is partially hollow to contain an insulator 20 which in turn has disposed therewithin a central conductor 24, one end of which is coupled to a threaded bolt 28 on which is screwed a connecting nut 32. The central conductor 24 extends from the top of the insulator downwardly through a central bore formed in the insulator to a central electrode 36. The central electrode extends downwardly into a cavity 40 formed in the bottom of the body 12 as shown. A ground electrode 44 is attached to the body 12 to extend near to but spaced from the bottom end of the central electrode 36.

When operated in the conventional fashion, a high voltage signal is applied to the threaded bolt 28 of the spark plug 4 and this signal is carried by the central conductor 24 to the central electrode 36 to cause production of a spark between the central electrode 36 and the ground electrode 44.

The adapter unit 8 is constructed to enable placement of the unit over the top of a conventional spark plug 4 as shown in FIG. 1. The adapter unit 8 includes a generally hollow casing 50 dimensioned to enable reception into the hollow of the top portion of a spark plug. Mounted in the casing 50 is a first piezoelectric crystal 54 and a second piezoelectric crystal 58 which is bonded to the first crystal 54 by, for example, high metallic bonding, soldering, etc. The piezoelectric crystal 54 is a high voltage crystal which produces a high voltage electrical signal on the order of from eight to fifty kilovolts when deformed. The piezoelectric crystal 58 is a low voltage crystal which responds to a low voltage signal received over a conductor 62 by deforming. When the piezoelectric crystal 58 deforms, it causes the crystal 54 to thereby deform to produce a high voltage signal which is applied to a bridging element 66. The specific structures and shapes of the piezoelectric crystals 54 and 58 may be readily selected to result in the desired deformation and thus production of the desired high voltage signal.

The bridging element 66 includes an upper leg 72 which is electrically coupled to the bottom of the piezoelectric crystal 54, and a lower cone portion 76 which fits over the connecting nut 32 of a conventional spark plug to make electrical contact therewith. In other words, the bridging element 66 provides an electrical path from the piezoelectric crystal 54 to the threaded bolt 28 of the spark plug 4. Thus, when a low voltage signal is applied to conductor 62 to deform the low voltage crystal 58, crystal 58 in turn causes deformation of the high voltage crystal 54 to cause it to produce a high voltage signal which is applied via the bridging element 66 to the threaded bolt 28 of the spark plug 4. The high voltage signal is conducted to the central electrode 36 to cause production of the desired spark.

A grounding conductor 80 extends from the junction between the crystals 54 and 58 downwardly to the bottom lip of the casing 50 so that when the casing is placed over the top of the spark plug 4, the conductor 80 contacts the spark plug body 12. The purpose of this is to ground the junction between the crystals so that the crystal 54 may produce the high voltage signal when deformed. This is a well known requirement of piezoelectric crystal technology.

In order to secure the adapter unit 8 on top of the spark plug 4, threaded openings are provided in the casing 50 to allow screwing thereinto of set screws 84 and 88. The set screws extend through the casing 50 to contact the insulator 20 of the spark plugs and secure the adapter unit 8 in place.

Although the adapter unit 8 has been described as including a second piezoelectric low voltage crystal 58 as the deforming mechanism for the high voltage piezoelectric crystal 54, it will become apparent from a description of the remaining figures that other deforming mechanisms could also be used in the adapter unit. These other deforming mechanisms will be discussed in connection with the other drawings.

Figure 2:
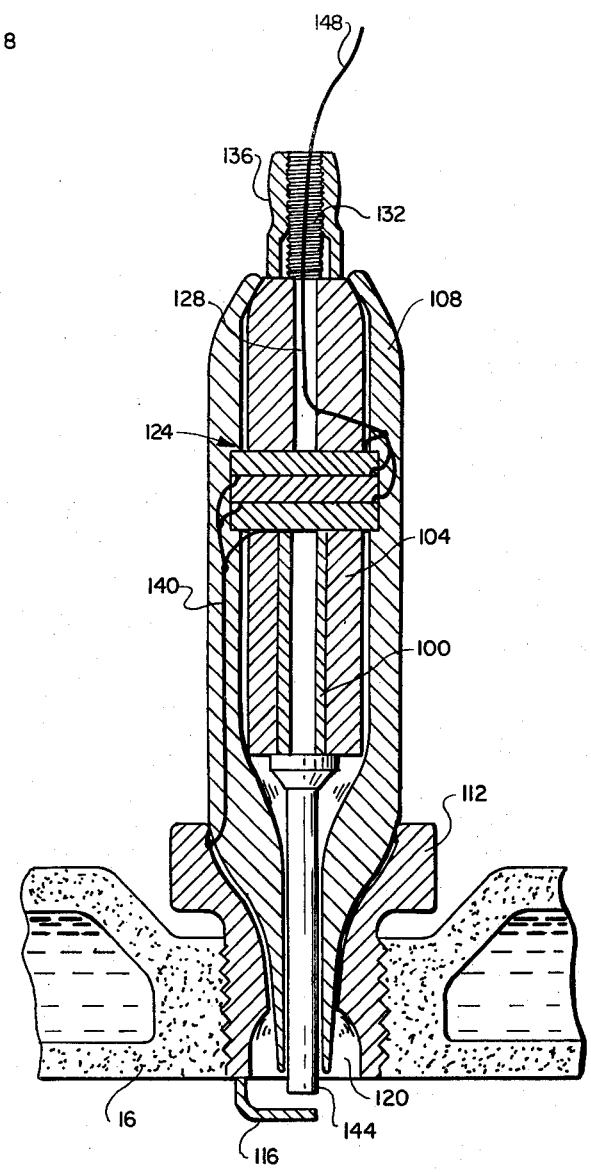
FIG. 2 is a side, cross-sectional view of a spark plug made in accordance with the present invention which utilizes low voltage piezoelectric crystals as the deforming mechanism of a high voltage piezoelectric crystal.

FIG. 2 shows a spark plug constructed to incorporate a high voltage piezoelectric crystal 100 formed in the shape of a long, hollow cylinder. The crystal 100 is confined within a hollow sleeve 104. The sleeve 104 and crystal 100 are, in turn, disposed in the hollow of an insulator 108 which is seated in a conventional spark plug body 112. The body 112 includes a ground electrode 116 extending from the lower portion of the body over a hollow 120 formed in the bottom of the body.

Positioned above the crystal 100 and sleeve 104 and mechanically coupled to the crystal 100 are a stack of low voltage piezoelectric crystals 124. The crystals 124 are secured together in a stack as shown with the top surface of each crystal being connected to a conductor 128 which is coupled to a threaded bolt 132 at the top of the spark plug. A conventional connecting nut 136 is screwed onto the top of the threaded bolt 132. The bottom of each crystal in the stack 124 is connected by conductor 140 to the spark plug body 112 to complete the circuit for the crystal stack 124. The top of the high voltage piezoelectric crystal 100 is also coupled by way of conductor 140 to the spark plug body 112.

Disposed below the crystal 100 and electrically coupled thereto is a central electrode 144. The central electrode extends from the bottom of the crystal 100 into the cavity 120 of the spark plug body 112 to a point close to but spaced from the ground electrode 116, as in a conventional spark plug.

In operation, a low voltage electrical signal is supplied by way of conductor 148 to the bolt 132 and from there conducted to the crystal stack 124 to cause the crystal stack to deform. Deformation of the crystal stack 124, in turn, causes crystal 100 to deform such as by compression, to thereby produce a high voltage electrical signal which is supplied to the central electrode 144. A spark is thus produced between the central electrode 144 and the ground electrode 116 as desired.

Figure 3:
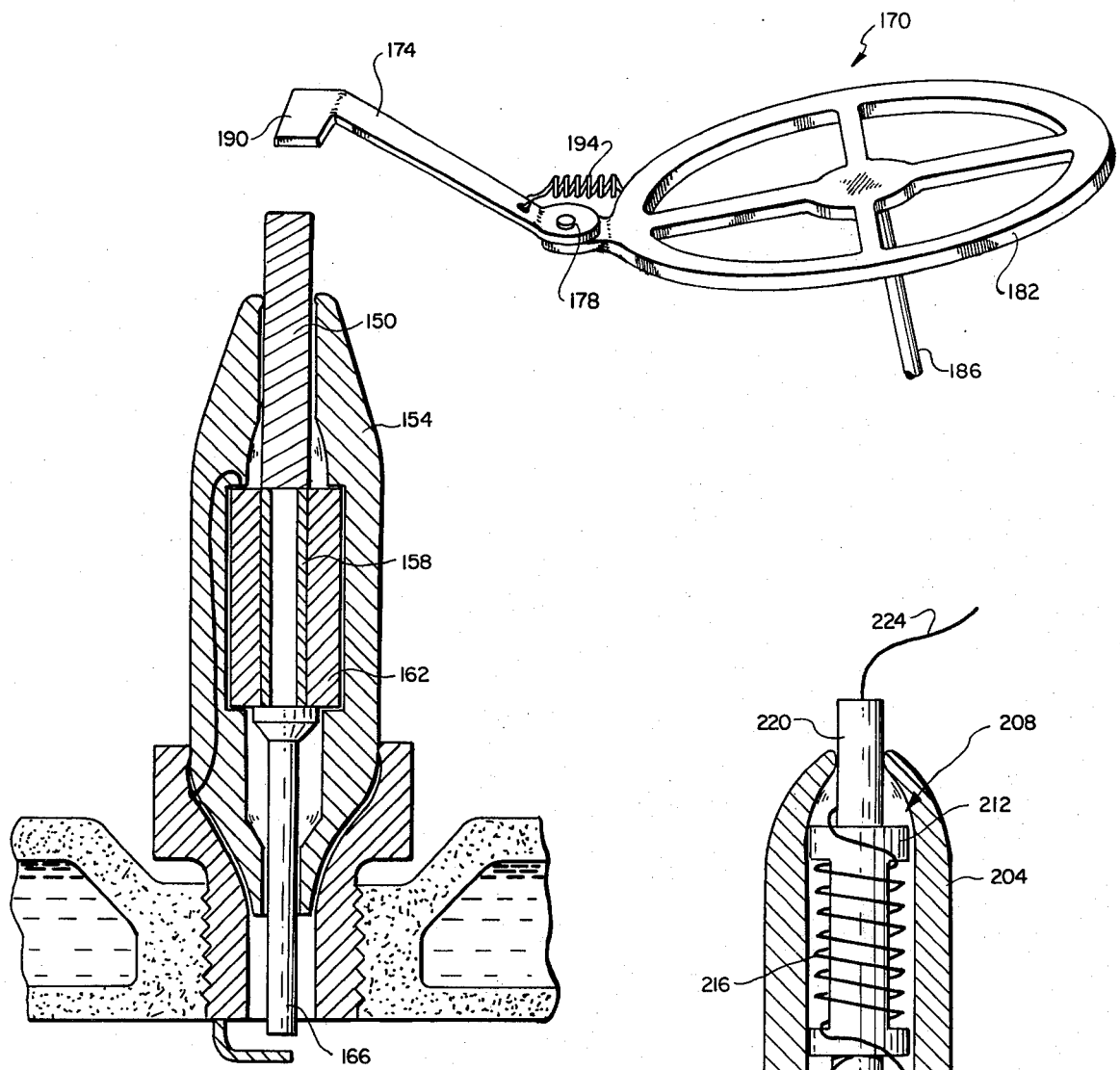
FIG. 3 shows a side, cross-sectional view of another embodiment of a spark plug made in accordance with the present invention in which a movable striker element is utilized as the mechanism for deforming the piezoelectric crystal.

FIG. 3 shows another embodiment of a mechanism for deforming the high voltage piezoelectric crystal of the spark plug. This mechanism includes a slideable rod 150 disposed in the top portion of the hollow of an insulator 154. The bottom end of the rod 150 is in contact with the top of a high voltage piezoelectric crystal 158 which is contained within a confining sleeve 162 as in the FIG. 2, embodiment. The bottom of the crystal 158 is electrically coupled to a central electrode 166 as already discussed.

The rod 150 is slideable within the hollow of the insulator 154 so that when the top end of the rod is struck, it applies a pressure to the top of the crystal 158. A striker mechanism 170 is provided to impart a force against the top of the rod 150 and this mechanism includes a striker hammer 174 pivotally attached by way of a hinge 178 to a wheel 182. The wheel 182 is arranged to rotate about an axle 186 to bring a striker head 190 of the hammer 174 into contact with the top of the rod 150. That is, the wheel 182 is rotated so that the head 190 of the hammer 174 periodically strikes the top of the rod 150 to cause the rod to apply pressure to the high voltage piezoelectric crystal 158 contained in the spark plug. A spring 194 secures the striker hammer 174 in a generally fixed position relative to the wheel 182 as the wheel is rotated but allows the hammer 174 to deflect out of the way after it strikes the top of the rod 150 so that the wheel 182 may simply continue rotation. The spring 194 may be a conventional coil spring.

Although the striker mechanism 170 has been shown as including a rotatable element, it should be understood that a variety of structures could be provided to periodically impart a force to the top of a rod 150.

Figure 4:
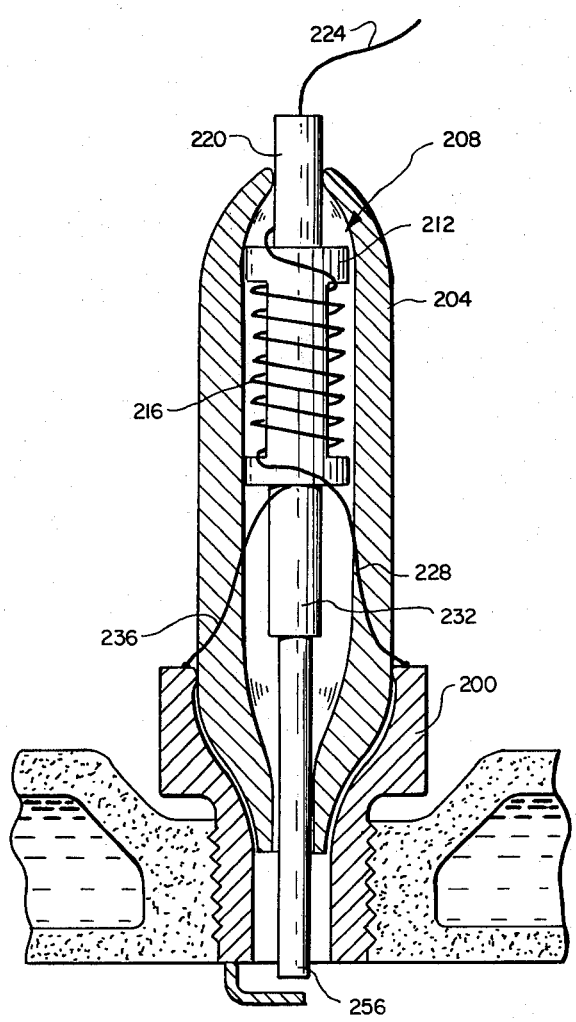
FIG. 4 is a side, cross-sectional view of a spark plug which utilizes a solenoid to deform the piezoelectric crystal.

FIG. 4 shows a side, partially cross-sectional view of still another embodiment of the invention which includes a spark plug body 200 which carries an insulator member 204. The hollow of the insulator member 204 carries the spark producing elements of the invention which include a solenoid 208. The solenoid 208 includes a spool-like sleeve 212 positioned in the hollow of the insulator 204 and about which is wound an electrical conductor 216. One end of the conductor 216 is coupled to a top conductor 220 for receiving a low voltage signal via conductor 224. The other end of the conductor 216 is coupled to the body 200 as shown by portion 228 of the conductor 216. Again, the top of a high voltage piezoelectric crystal contained within a sleeve 232 is coupled by way of a conductor 236 to the body 200.

Figure 6:
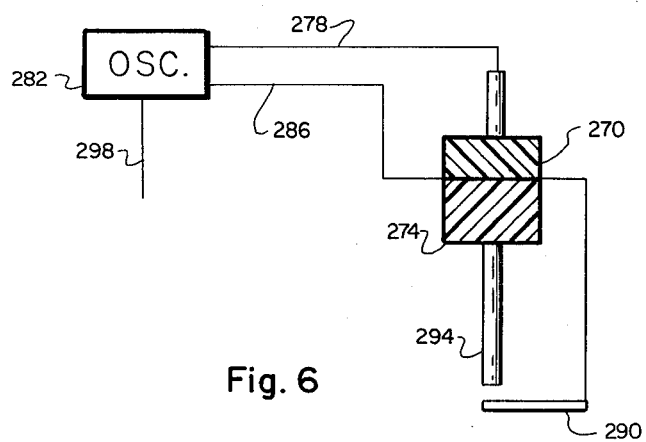
FIG. 6 is a schematic view of a spark plug which utilizes a resonating crystal to deform the piezoelectric crystal.

In a further embodiment, shown schematically in FIG. 6, a resonating piezoelectric crystal 270 is mechanically bonded to a high voltage piezoelectric crystal 274 in the manner earlier described. One output terminal 278 of a high frequency oscillator 282 is coupled to one side of the crystal 270, and the other output terminal 286 of the oscillator is coupled to the other side of the crystal. The bottom surface of the crystal 270 and top surface of the crystal 274 are coupled to a ground electrode which is spaced from the bottom end of a central electrode 294 in the same manner as described for the other embodiments. The top end of the central conductor 294 is coupled to the bottom surface of the crystal 274.

In operation, a low voltage signal is applied over conductor 298 to the oscillator to cause it to oscillate at a predetermined frequency. The oscillator, in turn supplies a low voltage oscillatory signal to the crystal 270 to cause it to resonate at the frequency of the oscillator. (The crystal 270 is cut to allow it to oscillate at the desired frequency.) Advantageously, the frequency of oscillation would be from 2 to 100 kilohertz. Upon reaching reasonance which is almost instantaneous upon application of the signal from the oscillator 282 to the crystal 270, the crystal deforms or deflects maximally to thereby stress or deform the high voltage crystal 274 to which it is mechanically coupled. The crystal 274 thereby produces a high voltage which is supplied to the central electrode 274 to cause a spark between the electrode and the ground electrode 290. The spark will continue so long as the crystal 274 is being subject to deformation which occurs for as long as crystal 270 resonates. Thus, the duration of the spark can be controlled by controlling the duration of oscillation of the crystal 270 which is controlled by the duration of the output of the oscillator 282 and this, finally, is controlled by the duration of the input signal supplied over conductor 298.

In this manner, the configuration of FIG. 6 allows production of a spark whose duration can be controlled. This is useful for maximizing combustion or fuel in a combustion chamber. The FIG. 6 arrangement could be either built into the spark plug body, as per the FIG. 2 arrangement, or included as part of an adapter unit, as per FIG. 1.

Figure 5:
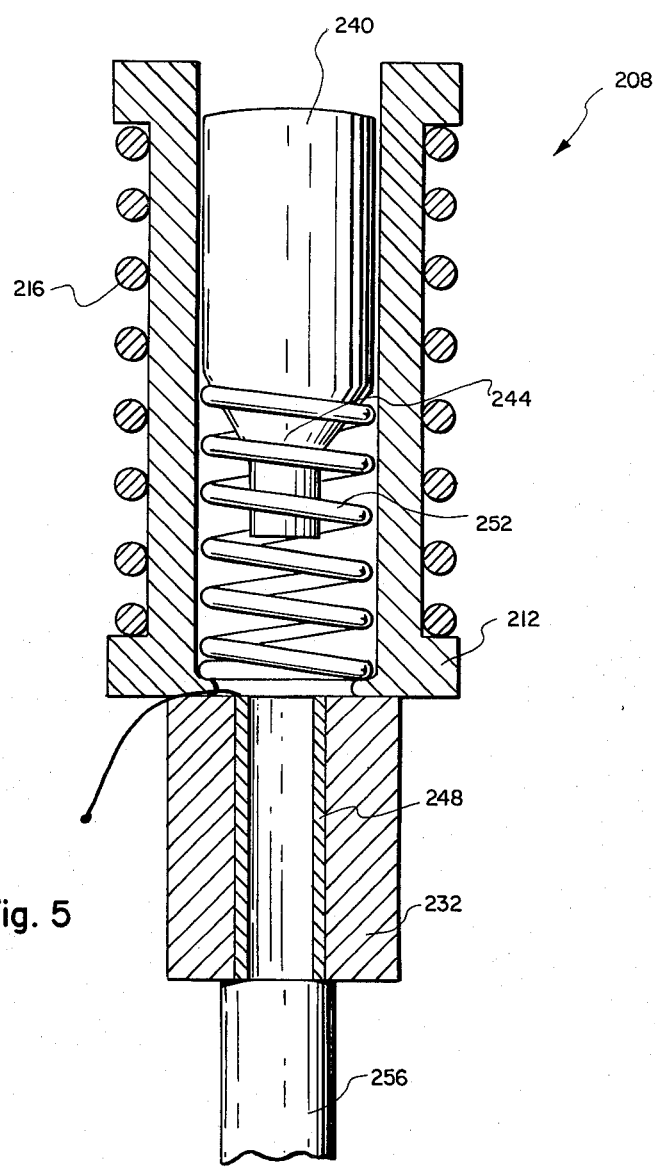
FIG. 5 is a side, cross-sectional view of the solenoid and a crystal structure of FIG. 4.

The details of the solenoid 208 are shown in FIG. 5 to include a movable core element 240 positioned in the hollow of the solenoid sleeve 212. The core element 240 is constructed of, for example, a solid piece of iron formed in the shape of an inverted bottle. The bottom of the core element 240 is formed in the shape of a hammer head 244 for contacting the top of a high voltage piezoelectric crystal 248 when a low voltage current is supplied to the conductor 216. The core element 240 is maintained near the top of the sleeve 212 by a conventional coil spring 252, but when a low voltage current is supplied to the conductor 216 to create a magnetic field within the sleeve 212, the core element 240 is pulled downwardly so that the hammer portion 244 strikes the top of the piezoelectric crystal 248 to cause it to produce the desired high voltage signal. This signal is supplied to a central electrode 256 to create the desired spark. Alternatively, the core element 240 may be located in contact with the crystal 248 so that when the solenoid is energized, the element applies a force to or stresses the crystal to produce the desired voltage signal.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A piezoelectric crystal spark plug assembly comprising
   an electrically conducting body,
   a first electrode mounted in said body and electrically insulated therefrom,
   a second electrode disposed near but spaced from one end of the first electrode and electrically coupled to the body,
   a first piezoelectric crystal, one side of which is electrically coupled to the other end of said first electrode, and
   means responsive to a low voltage electrical signal for mechanically deforming said crystal to cause it to produce and apply an electrical signal to said first electrode to thereby produce a spark between said first and second electrode, said means comprising a plurality of individual piezoelectric crystals structurally coupled together, a first side of each of said individual crystals being connected electrically to said low voltage signal, and a second side of said individual crystals being connected electrically to said body.

2. A spark plug assembly as in claim 1 wherein said first piezoelectric crystal is adapted to produce a high voltage electrical signal when deformed,
   and wherein said plurality of individual piezoelectric crystals are responsive to a low voltage oscillatory signal for resonating at substantially the same frequency as the frequency of the oscillatory signal, to deform the first crystal, said assembly further including oscillator means responsive to an input signal for supplying an oscillatory signal to said plurality of individual piezoelectric crystals.

3. A piezoelectric crystal spark plug assembly comprising
   an electrically conducting body,
   a first electrode mounted in said body and electrically insulated therefrom,
   a second electrode disposed near but spaced from one end of the first electrode and electrically coupled to the body,
   a piezoelectric crystal, one side of which is electrically coupled to the other end of said first electrode, and
   a solenoid mounted in said body and being responsive to a low voltage signal for operating to deform the piezoelectric crystal to cause it to produce and apply an electrical signal to said first electrode to thereby produce a spark between said first and second electrode, wherein said solenoid comprises
   a sleeve element,
   an electrical conductor wound about the sleeve element for creating a magnetic field within the sleeve element when a low voltage signal is applied to the conductor, and a core element disposed within the sleeve and movable to deform the crystal when a magnetic field is created within said sleeve.

4. A spark plug assembly as in claim 3 wherein said solenoid further comprises a biasing means disposed in said sleeve element to bias said core element away from and out of contact with said first crystal when no magnetic field is created within said sleeve.

5. A spark plug adapter for placement over the top of a spark plug comprising a body member having an opening therein for receiving the top of a conventional spark plug, said body member having a grounding element for contacting a grounded portion of the spark plug when the body member is placed over the spark plug, locking means for maintaining the body member in place over a spark plug, a first piezoelectric crystal disposed in said body member, and being responsive to deformation for producing an electrical signal, and conductor means electrically coupled one side of said crystal to the central electrode of a spark plug when the body member is placed over the spark plug.

6. A spark plug adapter as in claim 5 wherein said grounding element is electrically connected to the other side of said crystal.

7. A spark plug adapter as in claim 5 wherein said locking means comprises a threaded opening located in a wall of said body member adjacent a side of a spark plug over which the body member is placed, and a screw which is screwable into said threaded opening to contact the side of a spark plug over which the body member is placed.

8. A spark plug adapter as in claim 5 wherein said first piezoelectric crystal is a high voltage crystal for producing a high voltage electrical signal when deformed, said adapter further including a second low voltage piezoelectric crystal, one side of which is mechanically coupled to the other side of said first crystal, and responsive to a low voltage electrical signal for deforming to thereby deform said first crystal.

9. A spark plug adapter as in claim 8 further comprising a conductor, insultated from said body member, and extending from the other side of said second crystal to a location exterior of said body member.

10. A spark plug adapter as in claim 5 wherein said first piezoelectric crystal is a high voltage crystal for producing a high voltage electrical signal when deformed, said adapter further including a second low voltage piezoelectric crystal, one side of which is mechanically coupled to the other side of said first crystal, and responsive to a low voltage oscillatory signal for resonating to thereby deform the first crystal, and oscillator means responsive to an input signal for supplying an oscillatory signal to the second crystal.

* * * * *